United States Patent [19]
Tsutsu

[11] Patent Number: 6,118,151
[45] Date of Patent: *Sep. 12, 2000

[54] THIN FILM SEMICONDUCTOR DEVICE, METHOD FOR FABRICATING THE SAME AND SEMICONDUCTOR DEVICE

[75] Inventor: Hiroshi Tsutsu, Osaka, Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/449,495

[22] Filed: May 24, 1995

[30] Foreign Application Priority Data

May 24, 1994 [JP] Japan ..................................... 6-109233

[51] Int. Cl.$^7$ ..................................................... H01L 27/01
[52] U.S. Cl. ......................... 257/347; 257/410; 257/411; 257/616
[58] Field of Search ............................... 257/63, 65, 347, 257/410, 411, 616

[56] References Cited

U.S. PATENT DOCUMENTS

| | | | |
|---|---|---|---|
| 4,442,449 | 4/1984 | Lehrer et al. | 257/741 |
| 5,241,214 | 8/1993 | Herbots et al. | 257/411 |
| 5,250,818 | 10/1993 | Saraswat et al. | 257/616 |
| 5,461,250 | 10/1995 | Burghartz et al. | 257/66 |
| 5,468,987 | 11/1995 | Yamazaki et al. | 257/411 |
| 5,561,302 | 10/1996 | Candelaria | 257/77 |
| 5,602,403 | 2/1997 | Aklufi | 257/410 |

FOREIGN PATENT DOCUMENTS

| | | |
|---|---|---|
| 061 388 | 9/1982 | European Pat. Off. . |
| 0 449 620 | 10/1991 | European Pat. Off. . |
| 0 587 520 | 3/1994 | European Pat. Off. . |
| 1-235276 | 9/1989 | Japan . |
| 3-95969 | 4/1991 | Japan . |
| 3-165066 | 7/1991 | Japan . |
| 5-283691 | 10/1993 | Japan . |

OTHER PUBLICATIONS

S.–G. Park et al., "Kinetics and Mechanism of Wet Oxidation of Ge$_x$Si$_{1-x}$ Alloys" *Journal of Applied Physics*, vol. 75, No. 3, pp. 1764–1770 (Feb. 1, 1994).

H. Okada et al., "High–Mobility Amorphous–Silicon MOS Transistors", *Japanese Journal of Applied Physics*, Part 2 (Letters), vol. 25, No. 9, pp. L718–L721 (Sep. 1986).

Huang–Chung Cheng et al., "Characteristics of Polycrystalline Silicon Thin–Film Transistors with Thin Oxide/Nitride Gate Structures", *Optical Engineering*, vol. 32, No. 8, pp. 1798–1802 (Aug. 1993).

H. Tsutsu et al., "Oxidation of Polycrystalline–SiGe Alloys", *Applied Physics Letters*, vol. 64, No. 3, pp. 297–299 (1994). Jan. 1994.

H. Tsutsu et al., "Oxidation of Epitaxial– and Polycrystalline–SiGe Alloys", *Mat. Res. Soc. Symp. Proceedings Reprint*, vol. 326, pp. 227–232 (1994). Dec. 1994.

T.J. King et al., "A polycrystalline–Si$_{1-x}$Ge$_x$–Gate CMOS Technology", *IEDM 90*, pp. 253–256 (1990). Dec. 1990.

T.J. King et al., "A Low–Temperature ($\leq$ 550° C.) Silicon–Germanium MOS Thin–Film Transistor Technology for Large–Area Electronics", *IEDM 91*, pp. 657–570 (1991). Dec. 1991.

T.J. King et al., "PMOS Transistors in LPCVD Polycrystalline Silicon–Germanium Films", *IEEE Electron Device Letters*, vol. 12, No. 11 pp. 584–586 (1991). Nov. 1991.

(List continued on next page.)

*Primary Examiner*—Mark V. Prenty
*Attorney, Agent, or Firm*—Ratner & Prestia

[57] ABSTRACT

A thin film semiconductor device includes: a substrate having an insulating surface; a semiconductor layer containing silicon and germanium formed on the substrate; a gate insulating film formed on the semiconductor layer; and a gate electrode formed on the gate insulating film, wherein the gate insulating film includes a thermal oxide film formed by thermally oxidizing a surface of the semiconductor layer.

5 Claims, 4 Drawing Sheets

OTHER PUBLICATIONS

H. Ohshima et al., "Full–Color LCDs with Completely Integrated Drivers Utilizing Low–Temperature Poly–Si TFTs", *SID 93 Digest*, pp. 387–390 (1993). Dec. 1993.

G. Kawachi et al., "Large Area Doping Process for Fabrication of the p–Si TFT's Using Bucket Ion Source and XeCl Excimer Laser Annealing", *Extented Abstracts of the 22nd (1990 International) Conference on Solid State Devices and Materials, Sendai*, pp. 971–974 (1990). Dec. 1990.

A. Yoshida et al., "Fabrication of a–Si: H TFT's by a Large Area Ion Doping Technique", *Extended Abstracts of the 22nd (1990 International) Conference on Solid State Devices and Materials, Sendai*, pp. 1197–1198 (1990). Dec. 1990.

W.J. Edwards et al., "Diffusion of Ge Along Grain Boundaries During Oxidation of Polycrstalline Silicon–Germanium Films", *Mat. Res. Soc. Symp. Proceedings Reprint*, vol. 319, pp. 183–188 (1994). Dec. 1994.

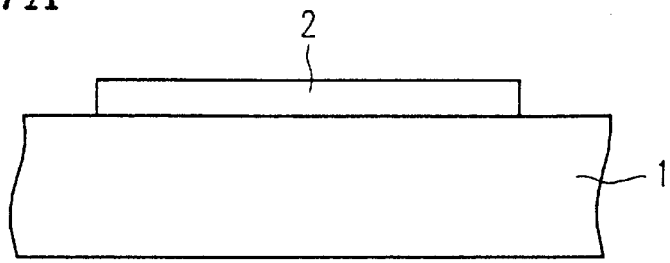
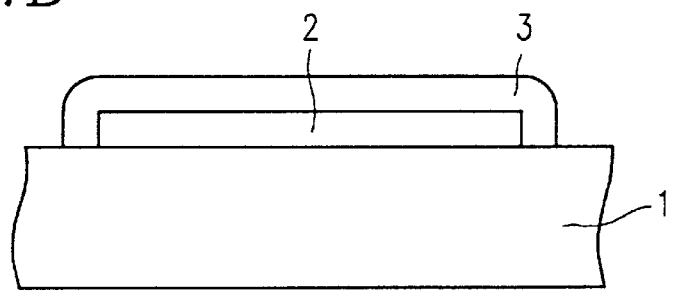
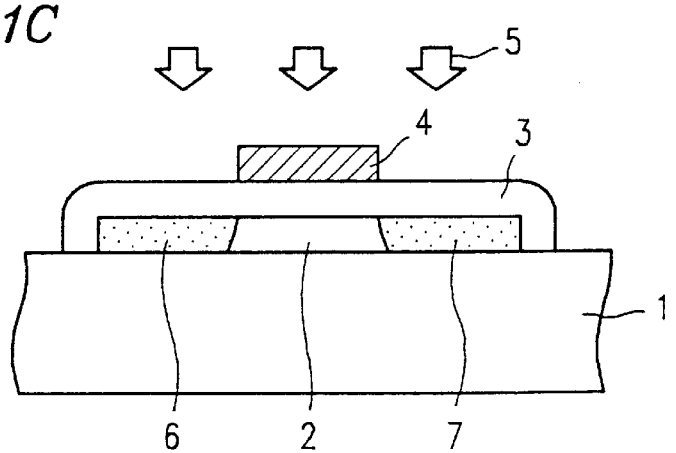
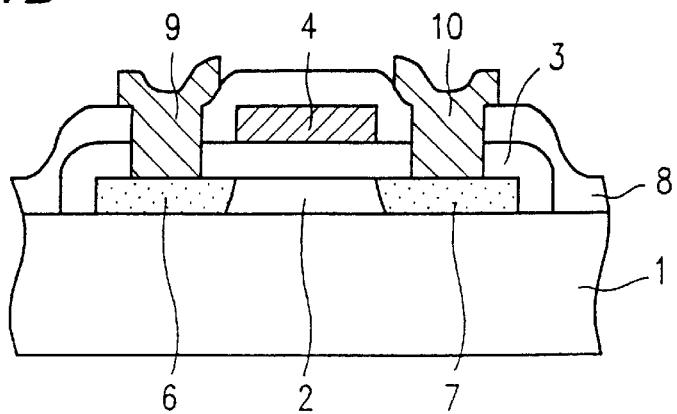

THIN FILM SEMICONDUCTOR DEVICE, METHOD FOR FABRICATING THE SAME AND SEMICONDUCTOR DEVICE

BACKGROUND OF THE INVENTION

1. Field of the Invention

The present invention relates to a thin film semiconductor device, and a method for fabricating such a thin film semiconductor device. In particular, the present invention relates to a thin film semiconductor device used for a liquid crystal display device (hereinafter, abbreviated as "LCD") for driving liquid crystal, a sensor for reading images, a load of RAM (Random Access Memory) and the like, and a method for fabricating such a thin film semiconductor device.

2. Description of the Related Art

A thin film semiconductor device includes a thin film semiconductor layer formed on a substrate having an insulating surface such as a quartz substrate or a glass substrate. A thin film transistor (TFT) is utilized in various fields. Hereinafter, a conventional example of a polycrystalline silicon thin film transistor, which has been developed for the use for a liquid crystal display (LCD), will be described.

Recently, in the field of the liquid crystal display using the thin film transistor, a polycrystalline silicon thin film transistor (hereinafter, referred to as a "low-temperature poly-Si TFT"), which can be fabricated at a relatively low temperature (about 600° C. or less) at which inexpensive glass substrates can be used instead of expensive quartz substrates, has attracted attention. However, one of the important problems to be solved of the low-temperature poly-Si TFT is the improvement in quality of a gate insulating film. Therefore, various gate insulating films have been examined.

A low-temperature poly-Si TFT described in "Society of Information Display International symposium Digest of Technical Papers/Volume XXIV (1993) pp. 387–390" will be briefly described as a conventional example, with reference to FIGS. 4A to 4D.

The low-temperature poly Si TFT is fabricated as follows.

First, an amorphous silicon film is deposited on a top surface of a substrate 12, and then it is irradiated with a laser light so as to locally heat and melt the amorphous silicon film. As a result, the amorphous silicon film is crystallized, thereby obtaining a polycrystalline silicon film 13. Thereafter, the polycrystalline silicon film 13 is patterned into an island shape by photolithography and etching (FIG. 4A).

Next, after a gate insulating film 14 which consists of an $SiO_2$ layer is formed on the polycrystalline silicon film 13 by using an ECR-CVD method (FIG. 4B), a gate electrode 15 made of tantalum (Ta) is formed on the gate insulating film 14. Thereafter, by using the gate electrode 15 as a mask, impurities serving as donors or acceptors are introduced into the polycrystalline silicon film 13 by ion doping in which mass separation is not conducted, thereby forming a source region 16 and a drain region 17 (FIG. 4C). After forming an interlevel insulating film 18, a source electrode 19 and a drain electrode 20 are formed on the insulating film 18. As a result, a low-temperature poly-Si TFT shown in FIG. 4D is fabricated.

In the conventional low-temperature poly-Si TFT shown in FIGS. 4A to 4D, the gate insulating film 14 which consists of an $SiO_2$ film is deposited by the ECR-CVD (Electron Cyclotron Resonance Chemical Vapor Deposition) method. Therefore, it has been reported that the low-temperature poly-Si TFT has good characteristics as compared with $SiO_2$ deposited by an AP-CVD (Atmospheric Pressure Chemical Vapor Deposition) method or LTO (low temperature oxide). However, even if the ECR-CVD method is used, the most important interface of semiconductor/insulating film, which affects device characteristics, becomes remarkably unstable. The reason for this is that the $SiO_2$ layer functioning as the gate insulating film 14 is deposited after the polycrystalline silicon layer 13 is formed and the substrate is subjected to processes such as a cleaning process. The state of the interface between the insulating film deposited by a CVD method and the semiconductor may greatly change due to various conditions such as a cleaning condition before depositing the insulating film, waiting time after the cleaning until deposition, an atmosphere immediately before the deposition. As a result, the interfacial states at the semiconductor/insulating film interface may be remarkably degraded. Thus, characteristics of a thin film transistor are prone to be degraded. Moreover, in order to perfectly control the interfacial states density, it is necessary to strictly control the fabrication conditions. Therefore, this method is not suitable for mass production. Furthermore, the method has another problem that the production yield is low due to pin holes of the insulating film and the like since the gate insulating film is obtained by a CVD method.

In the field of LSI, a thermal oxide film made of silicon is generally utilized as a gate insulating film in order that the interfacial states density is controlled at a predetermined level or a lower level. However, growth of such a thermal oxide film requires high temperature process. Therefore, it is necessary to use an expensive quartz substrate which induces no strain even in a high-temperature process, resulting in an increase in the fabrication cost.

SUMMARY OF THE INVENTION

The thin film semiconductor device of this invention includes: a substrate having an insulating surface; a semiconductor layer containing silicon and germanium formed on the substrate; a gate insulating film formed on the semiconductor layer; and a gate electrode formed on the gate insulating film, wherein the gate insulating film includes a thermal oxide film formed by thermally oxidizing a surface of the semiconductor layer.

In one embodiment of the invention, the semiconductor layer is made of $Si_xGe_{1-x}$ (0<x<1).

In another embodiment of the invention, the semiconductor layer is made of $Si_xGe_{1-x}$ (0<x<0.8).

In still another embodiment of the invention, the gate insulating film is made of $Si_xGe_{1-x}$ $O_2$.

In still another embodiment of the invention, the gate insulating film includes another insulating film deposited on the thermal oxide film.

In still another embodiment of the invention, the another insulating film is made of silicon nitride.

The method for fabricating a semiconductor device of the present invention includes the steps of: forming a semiconductor layer containing silicon and germanium on a substrate having an insulating surface; forming a thermal oxide film on a surface of the semiconductor layer; forming a gate electrode on the thermal oxide film; and forming a source region and a drain region in the semiconductor layer by doping impurities acting as donors or acceptors in selected regions of the semiconductor layer.

In one embodiment of the invention, the semiconductor layer is annealed with an energy beam after formation of the semiconductor layer and prior to formation of the thermal oxide film, thereby melting/solidifying the semiconductor layer.

In another embodiment of the invention, the semiconductor layer is formed in an amorphous state, and the semiconductor layer is annealed after formation of the semiconductor layer and prior to formation of the thermal oxide film, thereby rendering the semiconductor layer polycrystalline or single-crystalline.

In still another embodiment of the invention, the thermal oxide film is grown at 700° C. or lower.

According to another aspect of the present invention, the semiconductor device includes a semiconductor layer made of $Si_xGe_{1-x}$ (0<x<1) and an insulating film formed on the semiconductor layer, wherein the insulating film includes an $Si_xGe_{1-x}O_2$ thermal oxide film formed by thermally oxidizing a surface of the semiconductor layer.

In one embodiment of the invention, the semiconductor layer functions as an interconnection line.

In another embodiment of the invention, the semiconductor layer functions as a gate electrode.

According to another aspect of the present invention, the thin film semiconductor device includes an insulating substrate and a plurality of thin film transistors formed on the insulating substrate, wherein at least one of the plurality of thin film transistors includes: a semiconductor layer containing silicon and germanium; a gate insulating film formed on the semiconductor layer; and a gate electrode formed on the gate insulating film, and wherein the gate insulating film includes a thermal oxide film formed by thermally oxidizing a surface of the semiconductor layer.

Thus, the invention described herein makes possible the advantages of (1) providing a thin film transistor having excellent performance and high reliability, which can use a low-cost glass substrate as a substrate and has a clean interface of semiconductor/insulating film, (2) providing a method for fabricating such a thin film transistor, and (3) a semiconductor device.

These and other advantages of the present invention will become apparent to those skilled in the art upon reading and understanding the following detailed description with reference to the accompanying figures.

BRIEF DESCRIPTION OF THE DRAWINGS

FIGS. 1A to 1D are schematic cross-sectional views each showing a main step of a fabrication method of a thin film transistor according to the present invention.

DESCRIPTION OF THE PREFERRED EMBODIMENTS

Figure 2A:
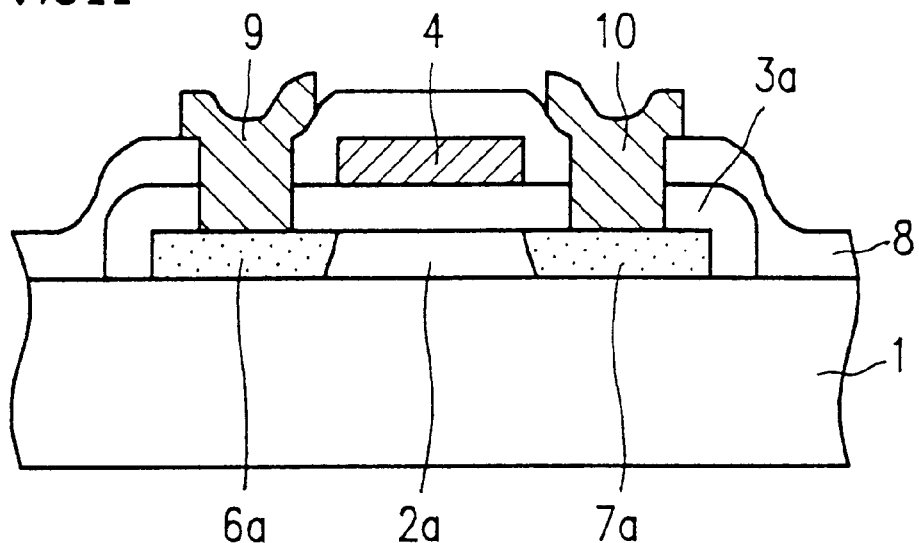
FIG. 2A is a schematic cross-sectional view showing another thin film transistor according to the present invention.

Hereinafter, the present invention will be described by way of illustrative examples with reference to the drawings.

EXAMPLE 1

With reference to FIGS. 1A to 1D, a first example of a thin film semiconductor device according to the present invention will be described. In this example, a glass substrate (glass #1737, fabricated by Corning Inc.) 1, on which an $SiO_2$ film acting as a buffer layer (not shown) is deposited in order to prevent the diffusion of impurities from the glass substrate, is used. The glass substrate 1 has a strain point of 667° C. From the viewpoint of reduction in cost, it is preferable to use an inexpensive glass having a strain point as low as possible as the glass substrate 1. Considering expansion or warp of the glass substrate 1 due to heat, it is preferable that the strain point of the glass substrate 1 is about +50° C. or more of the process maximum temperature.

First, an amorphous silicon-germanium film containing germanium at a concentration of 25% (hereinafter, referred to as an "a-$Si_{0.75}Ge_{0.25}$" film) is grown on the glass substrate 1 to a thickness of 100 nm. The a-$Si_{0.75}Ge_{0.25}$ film is formed by a CVD method using, for example, disilane ($Si_2H_6$) and germane ($GeH_4$) as material gases. Typically, the flow rate of disilane is in the range of 20 to 50 sccm, and the flow rate of germane is 10 to 30 sccm. It goes without saying that the flow rate of the gas changes depending on the size of the chamber and the like. It is preferable that the temperature of the glass substrate 1 during growth of the film is set to be in the range of 450° C. to 600° C.

Next, the a-$Si_{0.75}Ge_{0.25}$ film is patterned to form an island region having the size in accordance with the size of a transistor to be formed. The size of one island region is, for example, 10 μm×50 μm. In FIG. 1A, only one island region is shown. In actual, however, a plurality of island regions can be simultaneously formed. The patterning of the a-$Si_{0.75}Ge_{0.25}$ film can be carried out using normal photolithography and etching. As an etchant, for example, a mixture of hydrofluoric acid and nitric acid and the like can be used. In the case where dry etching is conducted, $CF_4$ or $SF_6$ to which $O_2$ is added is used.

Thereafter, an excimer laser light having a wavelength of 308 nm is radiated onto the a-$Si_{0.75}Ge_{0.25}$ film so as to melt/solidify (crystallize) the a-$Si_{0.75}Ge_{0.25}$ film. In this way, a semiconductor layer 2 made of polycrystalline silicon-germanium (hereinafter, referred to as "poly-$Si_{0.75}Ge_{0.25}$") is obtained. While the a-$Si_{0.75}Ge_{0.25}$ film is crystallized after being patterned in Example 1, the a-$Si_{0.75}Ge_{0.25}$ film may be crystallized before being patterned.

Next, the glass substrate 1 is inserted into a furnace at 600° C. Pure water held at 95° C. is subjected to bubbling with nitrogen or gaseous oxygen. By using steam obtained by the bubbling, the surface of the semiconductor layer 2 is thermally oxidized for two hours in the furnace. By the thermal oxidation, as shown in FIG. 1B, a thermal oxide film having a thickness of about 100 nm is formed. The thus obtained thermal oxide film, which is made of $Si_{0.75}Ge_{0.25}O_2$, is used as a gate insulating film 3. The thickness of the thermal oxide film changes depending on the conditions such as the concentration of germanium in silicon-germanium, the substrate temperature, the temperature of pure water serving as a steam source, the flow rate of bubbling gas and oxidation time period. In the case where the thermal oxide film is used as the gate insulating film of the thin film transistor, a preferred thickness of the thermal oxide film is in the range of 50 nm to 200 nm. As a method for thermally oxidizing the surface of the semiconductor layer 2, pyrogenic oxidation or dry oxidation may be used instead of steam oxidation. However, an oxidation method using the steam obtained by bubbling is suitable for obtaining a thermal oxide film having good quality at a relatively low temperature, for example, at about 600° C. or lower.

When silicon-germanium is thermally oxidized at about 700° C. or higher, silicon is selectively oxidized rather than germanium. As a result, germanium is precipitated at the interface of semiconductor/insulating film or part containing a large amount of silicon and part containing a large amount of germanium are formed in a layered manner in the oxide film. Therefore, it is necessary to determine an oxidation temperature with care. The oxidation temperature is preferably 700° C. or lower, more preferably, 600° C. or lower.

Next, after a chromium (Cr) film having a thickness of about 200 nm is deposited onto the gate insulating film 3 by, for example, sputtering, the Cr film is patterned by photolithography and etching, thereby forming a gate electrode 4 as shown in FIG. 1C. Next, by using the gate electrode 4 as an implantation mask, impurity ions 5 acting as donors or acceptors are implanted into the semiconductor layer 2. The impurity implantation is conducted by ion doping in which mass separation is not performed (alternatively, by bucket type ion doping method described in, for example, Extended Abstracts of the 22nd (1990) International Conference on Solid State Devices and Materials, p. 971 or p.1197). Plasma doping may be used instead of ion doping. Thereafter, a heat treatment (annealing) is conducted at a temperature in the range of about 300° C. to 600° C. so as to activate the impurities implanted into the semiconductor layer 2, thereby forming a source region 6 and a drain region 6 as shown in FIG. 1C.

Next, after forming an interlevel insulating film 8 which consists of an $SiO_2$ film by an Atmospheric-Pressure CVD method, contact holes are formed in the interlevel insulating film 8. Thereafter, a conductive film such as an aluminum (Al) film is formed on the interlevel insulating film 8 by sputtering. The conductive film is patterned by photolithography and etching so as to form a source electrode 9 and a drain electrode 10, thereby forming a thin film transistor as shown in FIG. 1D.

In the thin film transistor of the present invention, the semiconductor layer 2 is made of silicon-germanium alloy, and the gate insulating film 3 is made of the thermal oxide film obtained by thermally oxidizing the surface of the semiconductor layer 2. With this process, a cleaned interface of semiconductor/insulating film is formed. Therefore, a thin film transistor having excellent performance and high reliability can be fabricated. Furthermore, since the thin film transistor can be fabricated at a relatively low temperature, i.e., 600° C. or lower, not only a low-cost glass substrate can be used, but also the production yield can be enhanced.

If dangling bonds, which are present at the grain boundaries of a polycrystalline film, are terminated by hydrogen, transistor characteristics are further improved. Therefore, it is desirable to perform a hydrogenation process. The hydrogenation process is carried out by exposing the substrate to hydrogen plasma or hydrogen atoms at a substrate temperature of about 300° C., at any stage from the formation step of the source region 6 and the drain region 7 to the completion of the thin film transistor.

Moreover, although the silicon-germanium film having a germanium concentration of 25% is used as the semiconductor layer 2 in Example 1, the semiconductor layer of the present invention is not limited to the concentration. Generally, in the case where the oxidation temperature is about 600° C., the oxidation rate is increased as the germanium concentration increases. As a result, the oxidation time period is shortened. Therefore, it is preferable that the semiconductor layer 2 is made of $Si_xGe_{1-x}$ (0<x<0.8). Furthermore, since a field-effect mobility is increased as the germanium concentration increases, it is desirable that the germanium concentration is high. According to the present invention, a thin film transistor having the electron mobility of 50 $cm^2$/V·sec or more and the hole mobility of 30 $cm^2$/V·sec or more can be obtained.

In Example 1, a polycrystalline silicon-germanium layer, which is subjected to a crystallization process using a laser light, is used as the semiconductor layer 2. A single-crystalline silicon-germanium layer, which is epitaxially grown on a single-crystalline semiconductor substrate, or a single-crystalline silicon-germanium layer having an SOI (Semiconductor On Insulator) structure may also be used.

Although Cr is used as a material of the gate electrode 4 and Al is used as a material of the source electrode 9 and the drain electrode 10 in Example 1, metals such as aluminum (Al), tantalum (Ta), molybdenum (Mo), chromium (Cr) and titanium (Ti), and alloys thereof may be used as electrode materials. Alternatively, heavily doped polycrystalline silicon, a polycrystalline silicon-germanium alloy, or transparent conductive layers such as ITO may also be used.

Furthermore, it is possible to adopt an LDD (lightly doped drain) structure in order to improve OFF characteristics of a transistor. It is also possible to selectively form a P-channel type transistor and an N-channel type transistor by selectively using, as impurities, boron, arsenic and the like acting as acceptors and phosphorous, aluminum and the like acting as donors. As a result, a CMOS circuit is integrated on the substrate.

EXAMPLE 2

With reference to FIG. 2A, a second example of a thin film semiconductor device according to the present invention will be described.

In this example, a glass substrate (for example, glass #1733, fabricated by Corning Inc.) 1, on which an $SiO_2$ film acting as a buffer layer (not shown) is deposited in order to prevent the diffusion of impurities from the glass substrate, is used.

First, an amorphous silicon-germanium film containing germanium at a concentration of 50% (hereinafter, referred to as an "a-$Si_{0.50}Ge_{0.50}$" film) is formed on the glass substrate 1 to a thickness of 100 nm. The a-$Si_{0.50}Ge_{0.50}$ film is formed by CVD method using, for example, disilane ($Si_2H_6$) and germane ($GeH_4$) as material gases. Typically, the flow rate of disilane is in the range of 20 to 50 sccm, and the flow rate of germane is 20 to 50 sccm. It goes without saying that the flow rate of the gas changes depending on the size of the chamber and the like. It is preferable that the temperature of the glass substrate 1 during growth of the film is set to be in the range of 450° C. to 600° C.

Next, the a-$Si_{0.50}Ge_{0.50}$ film is patterned to form an island region having the size in accordance with the size of a transistor to be formed. In FIG. 2A, only one island region is shown. In actual, however, a plurality of island regions may be simultaneously formed. The a-$Si_{0.50}Ge_{0.50}$ film can be carried out using the same photolithography and etching as those of Example 1.

Next, a heat treatment is conducted at, for example, 550° C., thereby obtaining a semiconductor layer 2a made of polycrystalline silicon-germanium (hereinafter, referred to as "poly-$Si_{0.50}Ge_{0.50}$") This heat treatment can be conducted by using a conventional electric furnace in a vacuum atmosphere or an inert gas atmosphere.

Next, the glass substrate 1 is inserted into a furnace at 550° C. Pure water held at 95° C. is subjected to bubbling with nitrogen or gaseous oxygen. By using steam obtained by the bubbling, the surface of the semiconductor layer 2a is thermally oxidized for two hours in the furnace. By the thermal oxidation, a thermal oxide film having a thickness of about 100 nm is formed. The thus obtained thermal oxide film, which is made of $Si_{0.50}Ge_{0.50}O_2$, is used as a gate insulating film 3.

Subsequently, a gate electrode 4, a source region 6a, a drain region 7a, an insulating film 8, a source electrode 9 and a drain electrode 10 are formed in the same manner as that of Example 1, thereby obtaining a thin film transistor shown in FIG. 2A.

Although the polycrystalline silicon-germanium layer, which is crystallized by heat treatment, is used as the semiconductor layer 2a, a single-crystalline silicon-germanium layer may also be used. Moreover, the polycrystalline silicon-germanium layer, which is crystallized by laser irradiation, may also be used.

The gate insulating film 3 is formed by thermally oxidizing the semiconductor layer 2 containing germanium at a concentration of 25% at 600° C. for two hours in Example 1, and is formed by thermally oxidizing the semiconductor layer 2a containing germanium at a concentration of 50% at 550° C. for two hours in Example 2. The oxidation temperature of Example 2 is lower than that of Example 1. When the oxidation temperature is low, the oxidation rate also decreases. However, the decrease in the oxidation rate is compensated by enhancing the germanium concentration, thereby holding the same oxidation time period.

EXAMPLE 3

Figure 2B:
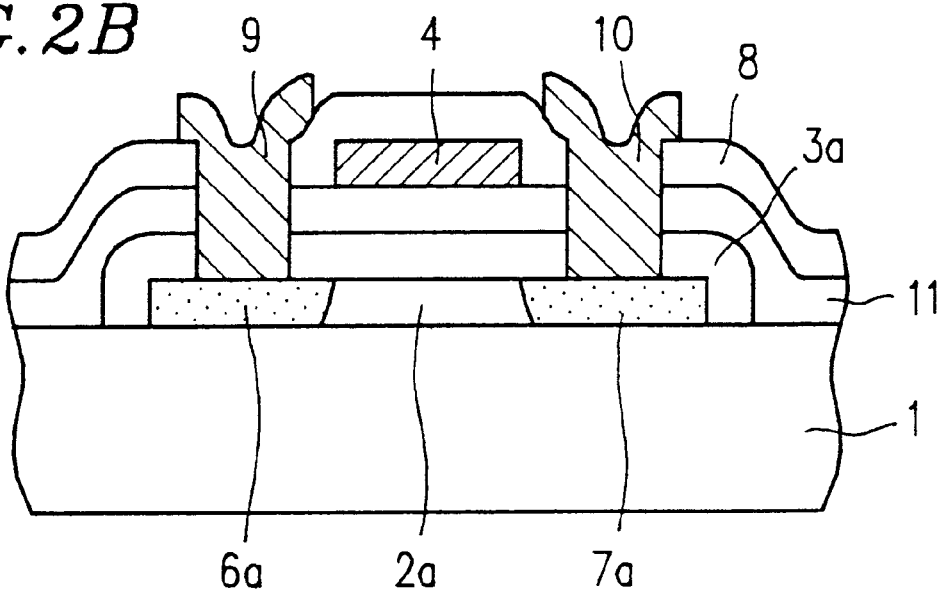
FIG. 2B is a schematic cross-sectional view showing still another thin film transistor according to the present invention.

With reference to FIG. 2B, a third example of a thin film semiconductor device according to the present invention will be described.

In this example, a glass substrate (for example, glass #1733, fabricated by Corning Inc.) 1, on which an $SiO_2$ film acting as a buffer layer (not shown) is deposited in order to prevent the diffusion of an impurity from the glass substrate, is used.

The thin film transistor of Example 3 differs from those described in the preceding examples in that the thin film transistor of Example 3 has a gate insulating film having a double-layered structure. More specifically, a second gate insulating film 11 which consists of a silicon nitride ($SiN_x$) layer is formed on a first gate insulating film 3a ($SiO_{0.50}Ge_{0.50}O_2$) serving as a thermal oxide film.

First, an amorphous silicon-germanium film containing germanium at a concentration of 50% (hereinafter, referred to as an "$a\text{-}Si_{0.50}Ge_{0.50}$" film) is formed on the glass substrate 1 to a thickness of 100 nm. The $a\text{-}Si_{0.50}Ge_{0.50}$ film is formed by a CVD method using, for example, disilane ($Si_2H_6$) and germane ($GeH_4$) as material gases. Typically, the flow rate of disilane is in the range of 20 to 50 sccm, and the flow rate of germane is 20 to 50 sccm. It goes without saying that the flow rate of the gas changes depending on the size of the chamber and the like. It is preferable that the temperature of the glass substrate 1 during growth of the film is set to be in the range of 450° C. to 600° C.

Next, the $a\text{-}Si_{0.50}Ge_{0.50}$ film is patterned to form an island region having the size in accordance with the size of a transistor element to be formed. In FIG. 2B, only one island region is shown. In actual, however, a plurality of island regions may be simultaneously formed. The $a\text{-}Si_{0.50}Ge_{0.50}$ thin film can be carried out using the same photolithography and etching as those of the preceding examples.

Next, a heat treatment is conducted at, for example, 550° C., thereby obtaining a semiconductor layer 2 made of polycrystalline silicon-germanium (hereinafter, referred to as "poly-$Si_{0.50}Ge_{0.50}$").

Then, the glass substrate 1 is inserted into a furnace at 550° C. Pure water held at 95° C. is subjected to bubbling with nitrogen or gaseous oxygen. By using steam obtained by the bubbling, the surface of the semiconductor layer 2 is thermally oxidized for two hours in the furnace. By the thermal oxidation, a thermal oxide film having a thickness of about 100 nm is formed. The thus obtained thermal oxide film, which is made of $Si_{0.50}Ge_{0.50}O_2$, is used as a first gate insulating film 3a. The thickness of the thermal oxide film changes depending on the conditions such as the concentration of germanium in silicon-germanium, the substrate temperature, the temperature of pure water serving as a steam source, the flow rate of bubbling gas, and oxidation time period. Next, a silicon nitride ($SiN_x$) layer is formed to a thickness of 100 nm by a CVD method, thereby obtaining the second insulating film 11. After the step of forming the gate electrode 4, the same steps as those of Examples 1 and 2 are carried out, thereby forming the thin film transistor shown in FIG. 2B.

The following advantageous effects can be obtained owing to the double-layered structure of the gate insulating film.

The insulation properties of the gate insulating films are improved, and therefore, the production yield is further improved. Moreover, owing to the second gate insulating film 11, the thermal oxide film (first gate insulating film) can be thinned. Thus, a time period required for thermal oxidation can be reduced. Although the oxidation is performed at 550° C. for two hours in Example 3, the thermal oxidation time may be shortened to about an hour. If the oxidation time is shortened, the processing throughput is improved.

Although a silicon nitride film is used as the second gate insulating film 11 in Example 3, other insulating films such as an $SiO_2$ film, a $TaO_x$ film may also be used.

Although solid-phase growth by heat treatment is used as a method for obtaining a polycrystalline silicongermanium layer as the semiconductor layer 2a, the semiconductor layer 2a can also be obtained by crystallization with laser irradiation. Moreover, a single-crystalline silicon-germanium layer may also be used as the semiconductor layer 2a.

Regarding the ratio of silicon and germanium which serve as the semiconductor layer 2 or 2a, the germanium concentration is preferably 20% or higher in terms of mobility. The reason for this is that carriers (electrons or holes) are scattered at the germanium concentration of 20% or lower, resulting in the lowered mobility. On the other hand, in terms of oxidation, it is desirable that the germanium concentration is high.

In the case where the semiconductor layer 2 or 2a is formed by laser irradiation, although the crystallization can be advantageously performed at room temperature, the crystal grain size cannot be formed so large. On the other hand, in the case where the semiconductor layer 2 or 2a is formed by heat treatment, although a relatively high temperature (about 550° C.) is required, the crystal grain has a large size, i.e., about one to several tens $\mu$m. As the crystal grain size becomes large, the mobility is further improved.

Although the glass substrate is used in the above examples, any substrate can be used as long as it has an insulating surface. For example, a normal single-crystalline silicon substrate, whose upper surface is covered with an insulating film, may also be used. In such a case, a device, in which a transistor formed on the single-crystalline silicon substrate and the thin film semiconductor device according to the present invention are integrated on the same substrate, is provided.

In the above examples, the case where the $Si_xGe_{1-x}$ layer is used as an active layer of the thin film transistor and the $Si_xGe_{1-x}O_2$ thermal oxide film is used as a gate insulating film is described. However, it is also possible to use the $Si_xGe_{1-x}$ layer as a conductive part of the gate electrode or the wiring in the semiconductor device, and the $Si_xGe_{1-x}O_2$ thermal oxide film as an insulating covering part of the conductive part. In such a case, appropriate impurities are doped into the semiconductor layer.

EXAMPLE 4

With reference to FIGS. 3A to 3D, a fourth example of a thin film semiconductor device according to the present invention will be described.

A field oxide film 33 with an n$^+$-channel stopper 34 is formed on an n$^-$-type silicon substrate 32 by a LOCOS (Local Oxidation Of Silicon) method so as to surround an active region on which an MOS transistor is to be formed. Next, a gate oxide film 35 is formed by thermal oxidation to a thickness of 10 to 30 nm. A polycrystalline silicon-germanium film is deposited to a thickness of 300 nm by using, for example, silane (SiH$_4$) and germane (GeH$_4$) as material gases. Typically, the flow rate of disilane is in the range of 20 to 50 sccm, and the flow rate of germane is 20 to 50 sccm. It goes without saying that the flow rate of the gas changes depending on the size of the chamber and the like. It is preferable that the temperature of the silicon substrate 32 during growth of the film is set to be in the range of 600° C. to 650° C.

Figure 3A:
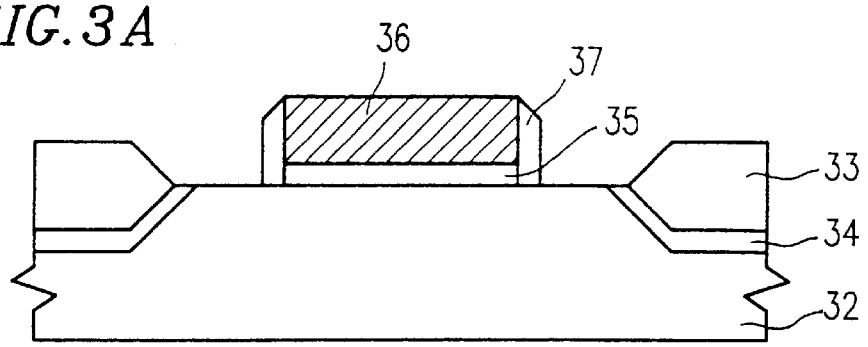
FIGS. 3A to 3D are schematic cross-sectional view showing still another thin film transistor according to the present invention.
Figure 3B:
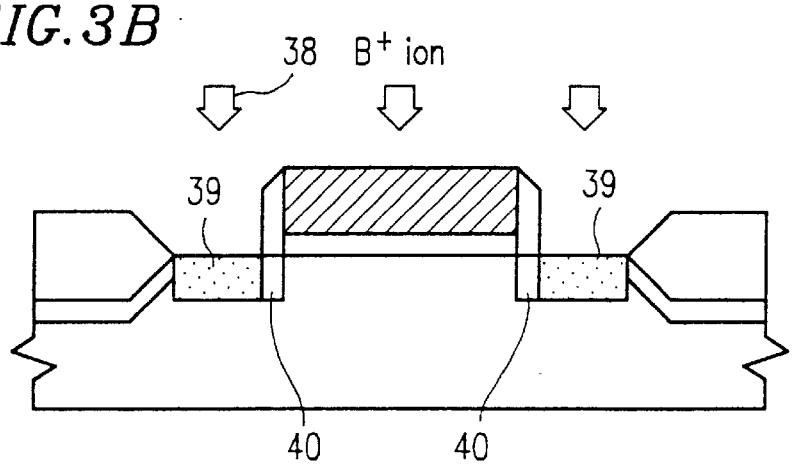

Next, exposed portions of the gate oxide film 35 are selectively removed by etching using a gate electrode as a mask. After depositing an SiO$_2$ film on the substrate 32 by a CVD method, sidewall spacers 37 are formed by etching back the SiO$_2$ film (FIG. 3A). Next, for example, boron (B) ions 38 are implanted into the substrate 32 to form a p$^+$-region (source/drain region) 39 by using the gate electrode and the spacer as masks (FIG. 3B). The dose of ions is reduced below the spacers 37 to form p$^-$-regions 40. As a result, an LDD (Lightly Doped Drain) structure is formed for alleviating electric field at the end of the drain region.

Figure 3C:
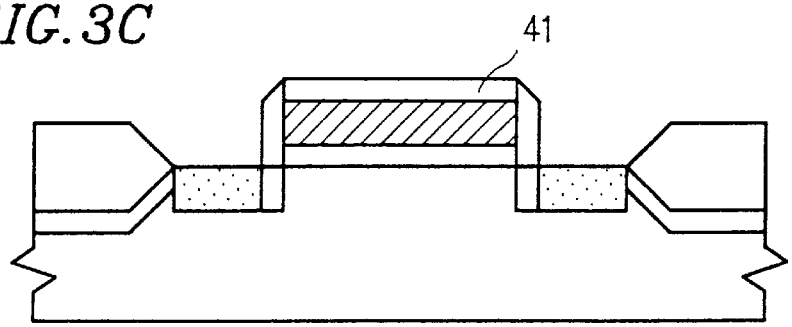
Figure 3D:
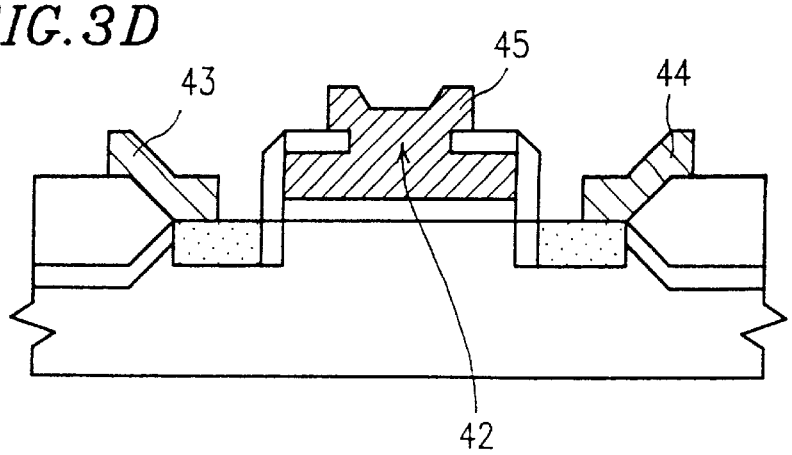
Figure 4A:
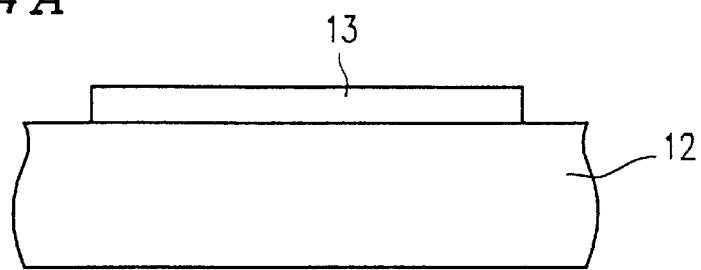
FIGS. 4A to 4D are schematic cross-sectional views each showing a main step of a fabrication method of a conventional thin film transistor.
Figure 4B:
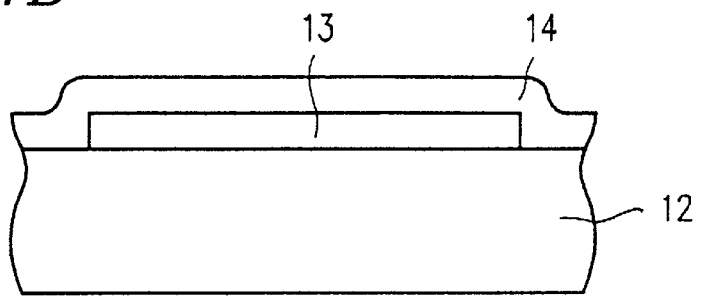
Figure 4C:
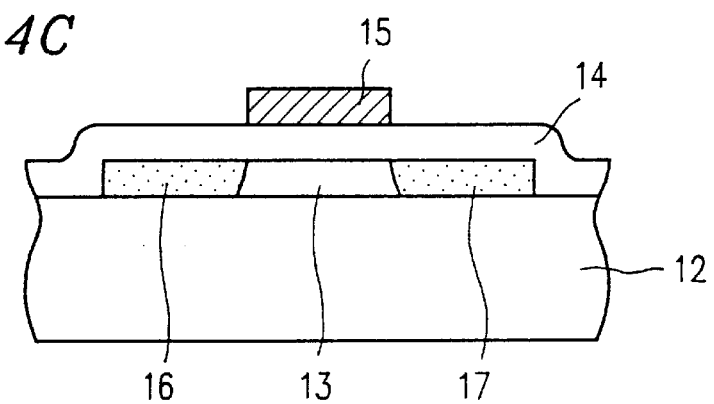
Figure 4D:
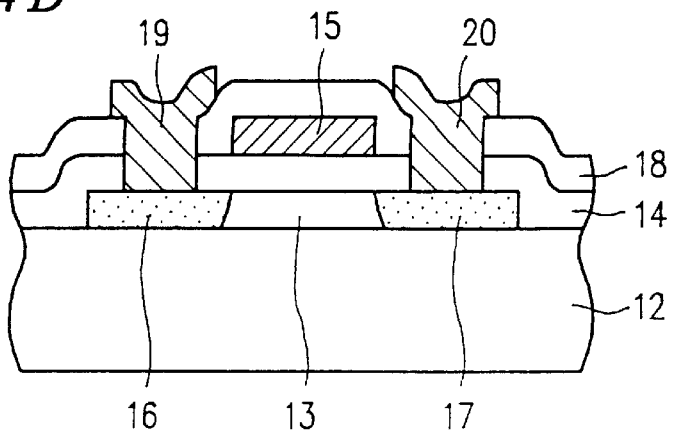

Then, the silicon substrate 32 is inserted into a furnace at 600° C. Pure water held at 95° C. is subjected to bubbling with nitrogen or gaseous oxygen. By using steam obtained by the bubbling, the surface of the polycrystalline silicon-germanium film layer is thermally oxidized for two hours in the furnace. By the thermal oxidation, a silicon-germanium oxide film 41 is formed (FIG. 3C). Silicon is hardly oxidized at the oxidation temperature. Only the polycrystalline silicon-germanium serving as the gate electrode is selectively oxidized. As a result, the gate electrode is electrically isolated without forming the interlevel insulating layer. Moreover, since the oxidation is conducted at 600° C., lateral diffusion of implanted boron ions is restrained to reduce parasitic capacitance and the like. As a result, device characteristics are improved. After forming a through hole 42, metallization is conducted with aluminum so as to form a source electrode 43, a drain electrode 44 and a gate electrode 45, thereby completing a p-type MOS transistor (FIG. 3D).

Although the through hole 42 is formed and the metallization for forming source/drain regions is conducted immediately after the polycrystalline silicon-germanium film is oxidized, the following process is also applicable. After the polycrystalline silicon-germanium film is oxidized, an insulating layer made of SiO$_2$ and Si$_3$N$_4$ is deposited by a CVD method. Thereafter, a through hole is formed. In this way, the production yield is further improved.

The method for forming the p-channel MOS transistor alone is described in Example 4. However, an nchannel MOS transistor or a CMOS structure can be produced by the same method. Furthermore, the method is also applicable to semiconductor devices other than the MOS transistor.

According to the present invention, a layer containing silicon and germanium is used as a semiconductor layer, and a thermal oxide film, which is obtained by thermally oxidizing the surface of the semiconductor layer, serves as a gate insulating film. As a result, a cleaned interface of semiconductor/insulating film can be formed by a process at a relatively low temperature (600° C. or lower). Therefore, a thin film semiconductor device can be fabricated with good production yield by using a relatively inexpensive glass substrate having a low strain point. Moreover, since the interface of semiconductor/insulating film can be held in a clean condition, it is possible to realize a thin film semiconductor device excellent in performance and reliability.

In the case where the layer containing silicon and germanium is used as a gate electrode or a wiring, since the surface of the electrode or the wiring is covered with a thermal oxide film of high quality, the electrode or the wiring, which is hardly short-circuited, can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film semiconductor device comprising:
   a substrate having an insulating surface;
   a semiconductor layer comprising $Si_xGe_{1-x}$ ($0<x<0.98$) formed on the substrate;
   a gate insulating film formed on the semiconductor layer; and
   a gate electrode formed on the gate insulating film,
   wherein the gate insulating film has a double-layered structure including: a thermal oxide film, which includes an oxide containing silicon and germanium, formed by thermally oxidizing a surface of the semiconductor layer; and another insulating film deposited over the thermal oxide film, and
   wherein said another insulating film is made of silicon nitride.

2. A thin film semiconductor device according to claim 1, wherein the semiconductor layer comprises $Si_xGe_{1-x}$ ($0<x<0.8$).

3. A thin film semiconductor device according to claim 1 or 2, wherein the thermal oxide film comprises $Si_xGe_{1-x}O_2$ ($0<x<0.98$).

4. A thin film semiconductor device comprising:
   a substrate having an insulating surface;
   a semiconductor layer comprising $Si_xGe_{1-x}$ ($0<x<0.98$) formed on the substrate;
   a gate insulating film formed on the semiconductor layer; and
   a gate electrode formed on the gate insulating film,
   wherein the gate insulating film has a double-layered structure including: a thermal oxide film, which includes an oxide containing silicon and germanium, formed by thermally oxidizing a surface of the semiconductor layer; and another insulating film deposited over the thermal oxide film, and
   said another insulating film comprises $SiN_x$, ($0<x<1$).

5. A thin film semiconductor device comprising:
   a substrate having an insulating surface;
   semiconductor layer comprising $Si_xGe_{1-x}$ ($0<x<0.98$) formed on the substrate;
   a gate insulating film formed on the semiconductor layer; and a gate electrode formed on the gate insulating film,
wherein the gate insulating film has a double-layered structure including: a thermal oxide film, which includes an oxide containing silicon and germanium, formed by thermally oxidizing a surface of the semiconductor layer; and another insulating film deposited over the thermal oxide film, and
said another insulating film comprises $TaO_x$, ($0<x<1$).

* * * * *

UNITED STATES PATENT AND TRADEMARK OFFICE
CERTIFICATE OF CORRECTION

PATENT NO. : 6,118,151
DATED : September 12, 2000
INVENTOR(S) : Tsutsu

It is certified that error appears in the above-identified patent and that said Letters Patent is hereby corrected as shown below:

On the Cover Page, Field [56], under OTHER PUBLICATIONS,
T. J. King et al., A Low-Temperature ... "pp.657-570" should read
-- pp. 567-570 --.

At column 10, line 64, "semiconductor layer" should read -- a semiconductor laser-- .

Signed and Sealed this

Eighth Day of May, 2001

*Attest:*

NICHOLAS P. GODICI

*Attesting Officer*     *Acting Director of the United States Patent and Trademark Office*